United States Patent
Lu (10) Patent No.: US 8,642,386 B2
(45) Date of Patent: Feb. 4, 2014

(54) HEAT SPREADER AS MECHANICAL REINFORCEMENT FOR ULTRA-THIN DIE

(75) Inventor: Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/206,390

(22) Filed: Aug. 9, 2011

(65) Prior Publication Data

US 2011/0294264 A1 Dec. 1, 2011

Related U.S. Application Data

(62) Division of application No. 11/479,403, filed on Jun. 30, 2006, now Pat. No. 8,063,482.

(51) Int. Cl.
*H01L 21/00* (2006.01)

(52) U.S. Cl.
USPC ............ 438/113; 438/109; 438/114; 438/118

(58) Field of Classification Search
USPC ................. 438/113, 114, 109, 118, 125, 126
See application file for complete search history.

(56) References Cited

U.S. PATENT DOCUMENTS

| | | | |
|---|---|---|---|
| 5,396,403 A * | 3/1995 | Patel | 361/705 |
| 5,552,635 A | 9/1996 | Kim et al. | |
| 5,949,137 A | 9/1999 | Domadia et al. | |
| 6,262,489 B1 | 7/2001 | Koors et al. | |
| 6,292,367 B1 | 9/2001 | Sikka et al. | |
| 6,314,639 B1 * | 11/2001 | Corisis | 29/827 |
| 6,441,499 B1 | 8/2002 | Nagarajan et al. | |
| 6,472,762 B1 | 10/2002 | Kutlu | |
| 6,504,723 B1 | 1/2003 | Fitzgerald et al. | |
| 6,952,050 B2 | 10/2005 | Kwon et al. | |
| 7,038,316 B2 | 5/2006 | Hu et al. | |
| 7,119,432 B2 | 10/2006 | Desai et al. | |
| 7,183,641 B2 | 2/2007 | Renavikar et al. | |
| 7,226,812 B2 | 6/2007 | Lu et al. | |
| 7,288,438 B2 * | 10/2007 | Lu | 438/122 |
| 2002/0074649 A1 | 6/2002 | Chrysler et al. | |
| 2002/0105071 A1 | 8/2002 | Mahajan et al. | |
| 2003/0067069 A1 | 4/2003 | Lebonheur et al. | |
| 2003/0090875 A1 | 5/2003 | Fitzgerald et al. | |
| 2003/0179549 A1 | 9/2003 | Zhong et al. | |
| 2004/0188814 A1 * | 9/2004 | Houle et al. | 257/678 |
| 2004/0195667 A1 | 10/2004 | Karnezos | |
| 2005/0001311 A1 | 1/2005 | Ho et al. | |
| 2005/0034841 A1 | 2/2005 | Barr et al. | |
| 2005/0070048 A1 | 3/2005 | Tolchinsky et al. | |

(Continued)

OTHER PUBLICATIONS

So, William W., et al. "High Temperature Joints Manufactured at Low Temperature", IEEE 1998, Electronics Components and Technology Conference, pp. 284-291.

(Continued)

*Primary Examiner* — Walter H Swanson
*Assistant Examiner* — Wilner Jean Baptiste
(74) *Attorney, Agent, or Firm* — Blakely, Sokoloff, Taylor & Zafman LLP (57) ABSTRACT

A technique to fabricate a package. A thin wafer supported by a wafer support substrate (WSS) is formed. The WSS-supported thin wafer layer is diced into a plurality of WSS-supported thin dice. A WSS-supported thin die is bonded to a first heat spreader (HS) to form a HS-reinforced thin die.

11 Claims, 8 Drawing Sheets

(56) References Cited

U.S. PATENT DOCUMENTS

| | | |
|---|---|---|
| 2005/0136640 A1 | 6/2005 | Hu et al. |
| 2005/0211749 A1 | 9/2005 | Hu et al. |
| 2005/0221598 A1* | 10/2005 | Lu et al. .................... 438/613 |
| 2005/0227415 A1* | 10/2005 | Farnworth et al. ............ 438/114 |
| 2006/0081978 A1* | 4/2006 | Huang et al. .................. 257/706 |
| 2006/0138643 A1 | 6/2006 | Lu et al. |
| 2006/0180924 A1 | 8/2006 | Andry et al. |
| 2006/0181858 A1 | 8/2006 | Kamemoto |
| 2006/0246687 A1 | 11/2006 | Kaiser et al. |
| 2006/0268521 A1 | 11/2006 | Coffin et al. |
| 2006/0273450 A1 | 12/2006 | Shi et al. |
| 2006/0273454 A1 | 12/2006 | Lu et al. |
| 2007/0023488 A1 | 2/2007 | Lawlyes et al. |
| 2007/0069369 A1 | 3/2007 | Hou et al. |
| 2007/0072339 A1 | 3/2007 | Chen et al. |
| 2007/0117270 A1 | 5/2007 | Renavikar et al. |
| 2007/0196953 A1 | 8/2007 | Fasano et al. |
| 2007/0200228 A1 | 8/2007 | Pu et al. |
| 2007/0206356 A1 | 9/2007 | Fitzgerald et al. |
| 2007/0270536 A1 | 11/2007 | Sachdev et al. |
| 2008/0000087 A1 | 1/2008 | Kuczynski et al. |
| 2008/0003719 A1 | 1/2008 | Lu et al. |
| 2008/0003720 A1 | 1/2008 | Lu et al. |
| 2008/0003780 A1 | 1/2008 | Sun et al. |
| 2008/0009095 A1 | 1/2008 | Charles et al. |
| 2008/0017223 A1 | 1/2008 | Sachdev et al. |
| 2008/0017975 A1 | 1/2008 | Deppisch et al. |
| 2008/0079125 A1 | 4/2008 | Lu et al. |
| 2008/0160673 A1 | 7/2008 | Lu et al. |
| 2008/0265407 A1 | 10/2008 | Lu et al. |
| 2009/0034206 A1 | 2/2009 | Lu et al. |
| 2009/0068791 A1 | 3/2009 | Wood |

OTHER PUBLICATIONS

Bock, K., et al. "New Manufacturing Concepts for Ultra-Thin Silicon and Gallium Arsenide Substrates", 2003 International Conference on Compound Semiconductor Manufacturing.

* cited by examiner

HEAT SPREADER AS MECHANICAL REINFORCEMENT FOR ULTRA-THIN DIE

This is a Divisional application of Ser. No. 11/479,403 filed Jun. 30, 2006, which is presently pending.

BACKGROUND

1. Field of the Invention

Embodiments of the invention relate to the field of semiconductor, and more specifically, to semiconductor packaging.

2. Description of Related Art

The demand for small footprint devices for use in applications such as smart cards, cellular devices, mobile communication, and mobile computing has led to many challenges in fabrication technologies. One such challenge is the development of ultra-thin packages.

Ultra-thin packages require reduced die thickness. The reduction of the die thickness becomes even more difficult as the diameter of the wafer is increased. There are currently four primary methods for wafer thinning: mechanical grinding, chemical mechanical polishing (CMP), wet etching, and atmospheric downstream plasma (ADP) dry chemical etching (DCE). During the fabrication phase, handling ultra-thin devices is difficult. Existing techniques to facilitate handling of ultra-thin dice or wafers have a number of disadvantages. For example, use of adhesive tapes is limited by the non-uniformity of the tape. Most of the available glues are thermally stable up to about 120° C., which may be too low for additional thermal processing. Other techniques such as dicing before grinding (DBG) or dicing by thinning (DbyT) may cause additional damage to the dice or wafers.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to fabricate a package. A thin wafer supported by a wafer support substrate (WSS) is formed. The WSS-supported thin wafer layer is diced into a plurality of WSS-supported thin dice. A WSS-supported thin die is bonded to a first heat spreader (HS) to form a HS-reinforced thin die.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to provide mechanical support for ultra-thin wafers or dice to facilitate their handling and processing. The technique includes using a wafer support substrate (WSS) as a temporary reinforcement and then using a rigid mini heat spreader (HS) as a permanent reinforcement. The WSS is attached to the wafer using a sacrificial adhesive. The wafer is then thinned to the desired thickness. The thinned wafer and the WSS are then diced together into individual dice. The die is then bonded to a mini HS. The WSS is removed or detached from the assembly by completely decomposing the sacrificial adhesive into gases during reflow or bonding. The die assembly including the mini HS is then assembled into a package. An integrated HS is attached the substrate, enclosing the die assembly. The technique thus provides superior mechanical support and/or reinforcement to facilitate handling the dice during the packaging process.

Figure 1A:
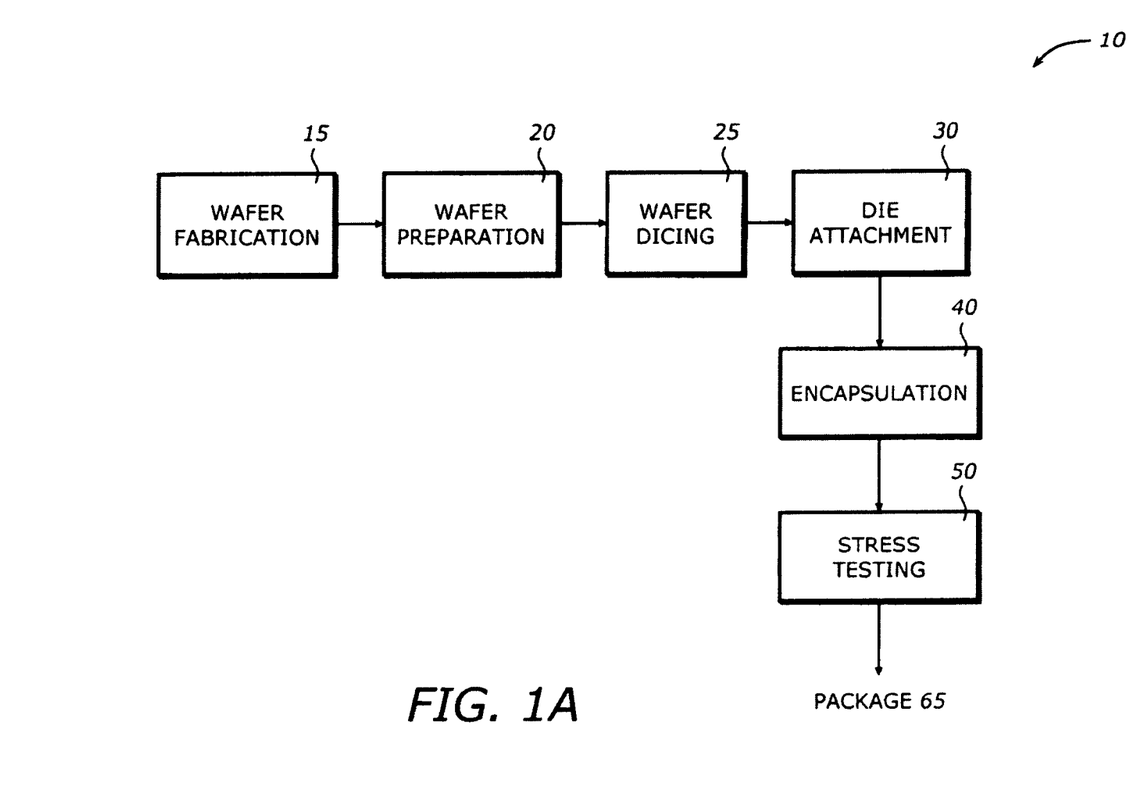
FIG. 1A is a diagram illustrating a manufacturing system in which one embodiment of the invention can be practiced.

FIG. 1A is a diagram illustrating a manufacturing system 10 in which one embodiment of the invention can be practiced. The system 10 includes a wafer fabrication phase 15, wafer preparation phase 20, a wafer dicing phase 25, a die attachment phase 30, an encapsulation phase 40, and a stress testing phase 50. The system 10 represents a manufacturing flow of a semiconductor packaging process.

The wafer fabrication phase 15 fabricates the wafer containing a number of dice. The individual dice may be any microelectronic devices such as microprocessors, memory devices, interface circuits, etc. The wafer fabrication phase 15 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or copper. The various metal layers are interconnected by etching holes, called "vias," in the insulating material.

The wafer preparation phase 20 prepares a wafer containing dice for packaging and testing. During this phase, the wafers are sorted after the patterning process. An inspection may be carried out to check for wafer defects. Then, the wafer may be mounted on a WSS that adheres to the front side or bump side of the wafer. The WSS provides mechanical support for handling during subsequent phases. Then the wafer is thinned to a desired thickness such as 50 to 100 microns.

The wafer dicing phase 25 dices, cuts, or saws the thin wafer with WSS into individual die assemblies (e.g., WSS supported thin dice). High precision saw blade and image recognition unit may be used. De-ionized water may be dispensed on the wafer to wash away any residual particles or contaminants during the dicing. Then, the wafer is dried by being spun at high spinning speed.

The die attachment phase 30 attaches the die assembly to first heat spreader and then attach the die-heat spreader to a package substrate. The substrate material depends on the packaging type. It may be made of an organic or inorganic material. The WSS is detached automatically during the die assembly to the first head spreader attach due to the complete decomposition of the sacrificial adhesive. The die may be electrically attached to the substrate through flip chip solder joints.

The encapsulation phase 40 underfills the gap between the die and the substrate. Underfill material may be dispensed between the die and the substrate. Integrated heat spreader (IHS) may be attached to the first head spreader. The fully assembled package 65 is ready to be tested.

The stress testing phase 50 performs one or more tests such as Highly Accelerated Stress Test (HAST) or biased-HAST on the device package under stress conditions. A test chamber may be designed to conduct a stress test. It may have monitoring circuits, measurement circuits, and other data processing equipment. The package 65 is placed in the test chamber subject to the stress test. It may be powered or non-powered. Various stress tests may be performed on the wafer or on the packaged devices 65 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 1B:
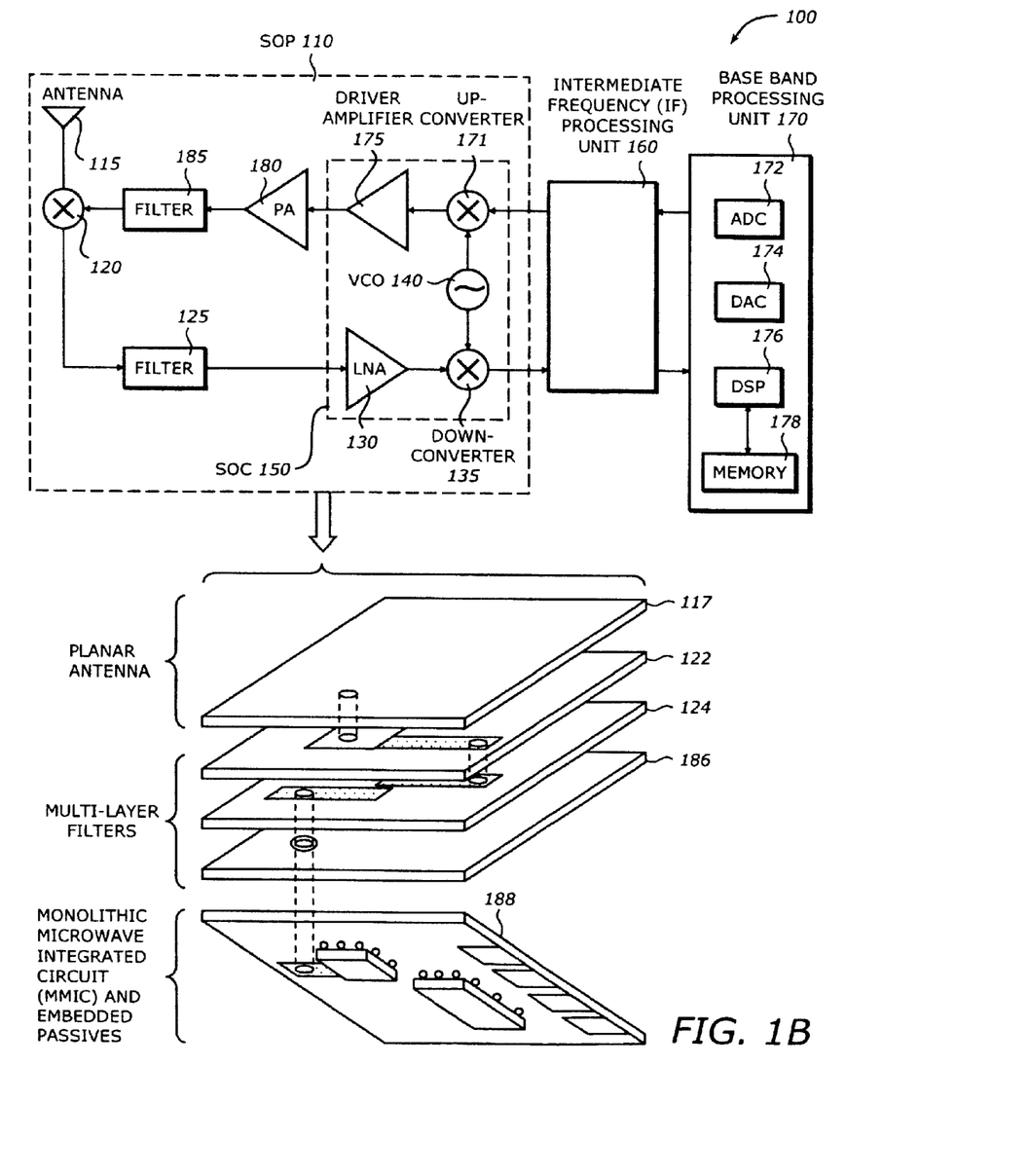
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and memory device 178. The ADC 172 and the DAC 174 are used to convert analog signals to digital data and digital data to analog signal, respectively. The DSP 176 is a programmable processor that may execute a program to process the digital data. The memory device 178 may be flash memories or random access memories. It may be packaged using Flip-Chip Ball Grid Array (FCBGA) packaging technology, a molded packaging, or any other suitable packaging technologies. The memory device 178 may be manufactured according to the manufacturing flow 10 shown in FIG. 1A. It may be the device package 65. It may include a stacked-die assembly in the package. The base-band processing unit 170 may also include memory and peripheral components. The DSP 176 may, therefore, be coupled to the front end processing unit via the IF processing unit 160 and/or the base-band processing unit 170 to process the digital data.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The 3D architecture may include multiple layers include a layer 117 to implement the antenna 115, layers 122, 124, and 186 for the filters 125 and 185, and layer 188 for the SOC 150 and the passive components using EP technology. Typically, the packaging technology involves embedded passives with multiple layers.

Figure 2A:
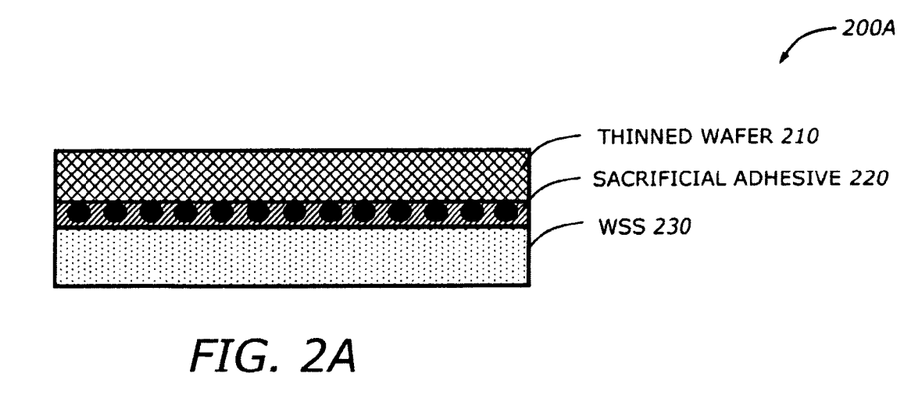
FIG. 2A is a diagram illustrating a wafer assembly with a wafer support substrate according to one embodiment of the invention.

FIG. 2A is a diagram illustrating a wafer assembly 200A with a wafer support substrate according to one embodiment of the invention. The wafer assembly 200A includes a bumped wafer 210, a sacrificial adhesive 220, and a WSS 230.

The bumped wafer 210 is any wafer that has been processed and having the bumps attached to the front side. The sacrificial adhesive 220 may be any suitable polymer adhesive that may be decomposed at high temperature. Examples of the adhesive may include certain polynorbornenes (e.g., Unity series from Premerus) and poly (alkyl arbonates) (e.g., QPAC series from Empower Materials). The sacrificial adhesive 220 may be applied to the bumped wafer 210 using any suitable technique such as spin-coating, spray-coating, or lamination. Additional processing on the wafer after application of the sacrificial layer 220 may be used, such as soft baking or lithographic exposure.

The WSS 230 may be any suitable support substrate, such as a glass wafer, a blank silicon wafer, or a glass support plate. The bumped wafer 210 is mounted onto the WSS 230 using the sacrificial adhesive 220 as an attachment material.

Figure 2B:
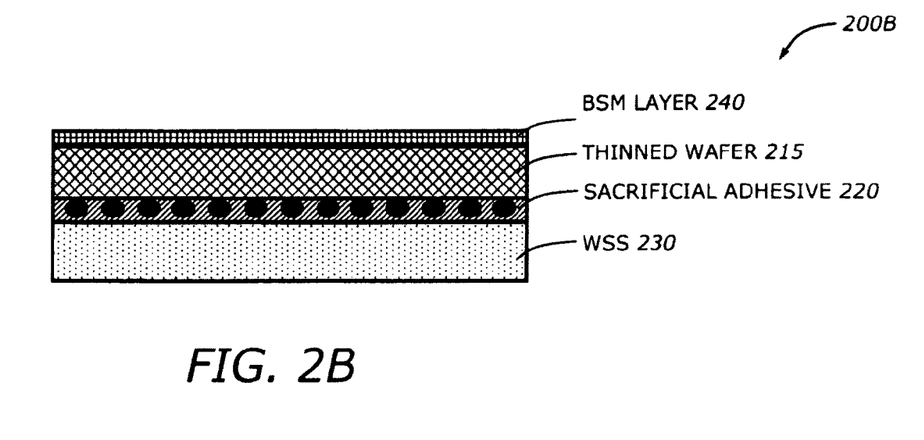
FIG. 2B is a diagram illustrating a wafer assembly with thinned wafer according to one embodiment of the invention.

FIG. 2B is a diagram illustrating a wafer assembly 200B with thinned wafer according to one embodiment of the invention. The wafer assembly 200B includes a thinned wafer 215, the sacrificial adhesive 220, the WSS 230 and a backside metallurgy (BSM) layer 240. The wafer assembly 200B is formed from the wafer assembly 200A by thinning the bumped wafer 210 and depositing the BSM layer 240.

The thinned wafer 210 may be thinned from the bumped wafer 210 using any suitable thinning technique such as dicing by grinding, chemical and mechanical polishing, etc. The thinned wafer 210 may have a thickness of less than 75 µm. After thinning, the BSM layer 240 is deposited on the backside of the thinned wafer 215. The BSM layer 240 may include several metal layers such as titanium (Ti), nickel (Ni) and gold (Au). It may also include a solder or solder alloy material such as In—Ag, Sn—Cu, or Sn—Ag—Cu, which may form high temperature solder joint at a low bonding temperature.

Figure 2C:
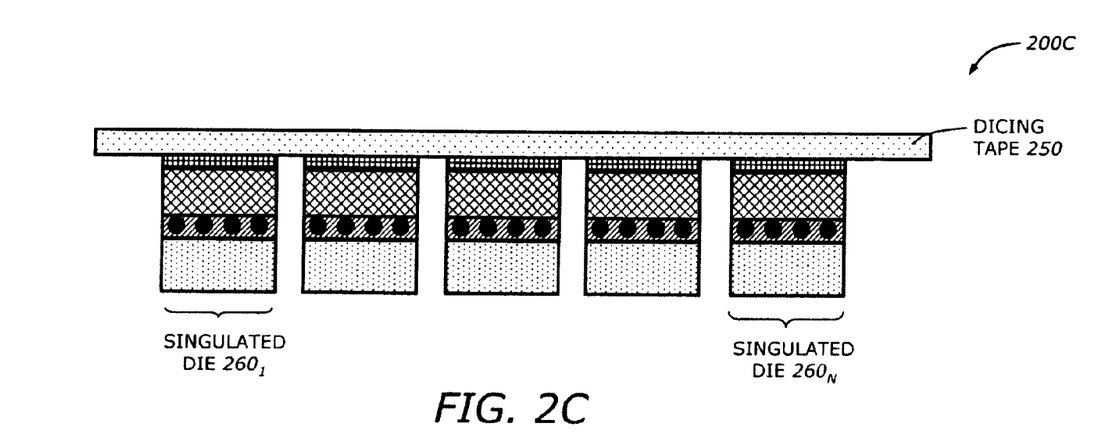
FIG. 2C is a diagram illustrating a diced wafer assembly according to one embodiment of the invention.

FIG. 2C is a diagram illustrating a diced wafer assembly 200C according to one embodiment of the invention. The diced wafer assembly 200C includes a dicing tape 250 and N diced or singulated dice $260_1$ to $260_N$. The diced wafer assembly 200C is formed from the wafer assembly 200B by mounting the WSS-supported thin wafer 200B onto the dicing tape 250, and dicing the thinned wafer and the WSS together.

The dicing tape 250 holds the WSS-supported thin wafer 200B before and after dicing. It may be any flexible Polyvinyl Chloride (PVC) with synthetic acrylic bonded to one side. It holds the singulated dice $260_1$ to $260_N$ after dicing. The WSS-supported thin wafer 200B, including the WSS 230, the sacrificial adhesive 220, the thinned wafer 215, and the BSM layer 240, is diced using any suitable dicing technology such as diamond blades.

Each of the singulated dice $260_1$ to $260_N$ includes the singulated WSS attached to the individual die. The WSS 230 provides a temporary mechanical reinforcement of the die to facilitate subsequent handling operations.

Figure 2D:
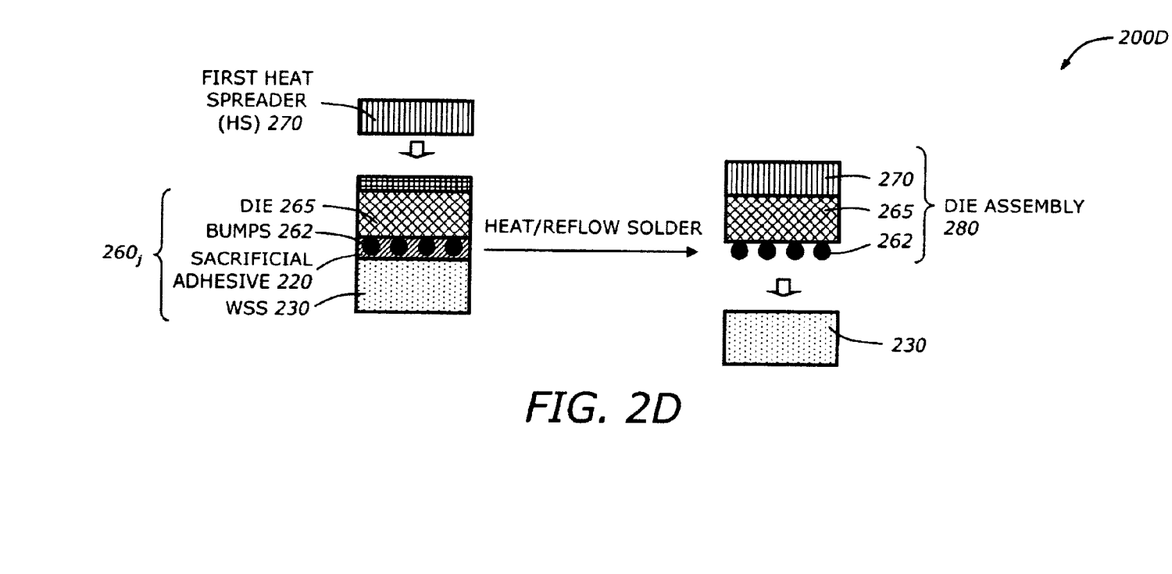
FIG. 2D is a diagram illustrating a die assembly with a wafer support substrate according to one embodiment of the invention.

FIG. 2D is a diagram illustrating a die assembly 200D with a wafer support substrate according to one embodiment of the invention. The die assembly 200D includes a die assembly 280. The die assembly 280 is formed from the WSS-supported thin die $260_j$ (j=1, . . . , N) from the diced wafer assembly 200C. The die assembly 280 includes a first heat spreader (HS) 270, the thinned die 265 singulated from the thinned wafer 215, and bumps 262 attached to the die 265.

The first HS 270 is a mini HS that fits to the die. Its size may be the same or slightly larger than the die. It may be made of any suitable material such as copper, SiC, or any other material that has high thermal conductivity. It may have a layer of solder on one side and the solder will act as the first thermal interface material (TIM) between the thin die and the first HS.

The WSS-supported thin die $260_j$ is bonded to the first HS 270 to form a HS-reinforced thin die. During bonding, heat is applied and the solder is reflowed. The reflow causes the sacrificial adhesive 220 to decompose into gases. This decomposition causes the WSS 230 to be detached from the thinned die. In one embodiment, the bonding temperature may be above 180° C. and the sacrificial adhesive 220 may be a polymer (e.g., Unity 2203P from Promerus) that starts to decompose at 180° C. or above. The sacrificial adhesive 220 may decompose into gases without leaving any residue. The WSS 230 therefore may be removed. The thinned die is now reinforced by the permanent first HS 270. The die assembly 280 is now ready to be attached to a substrate.

Figure 3:
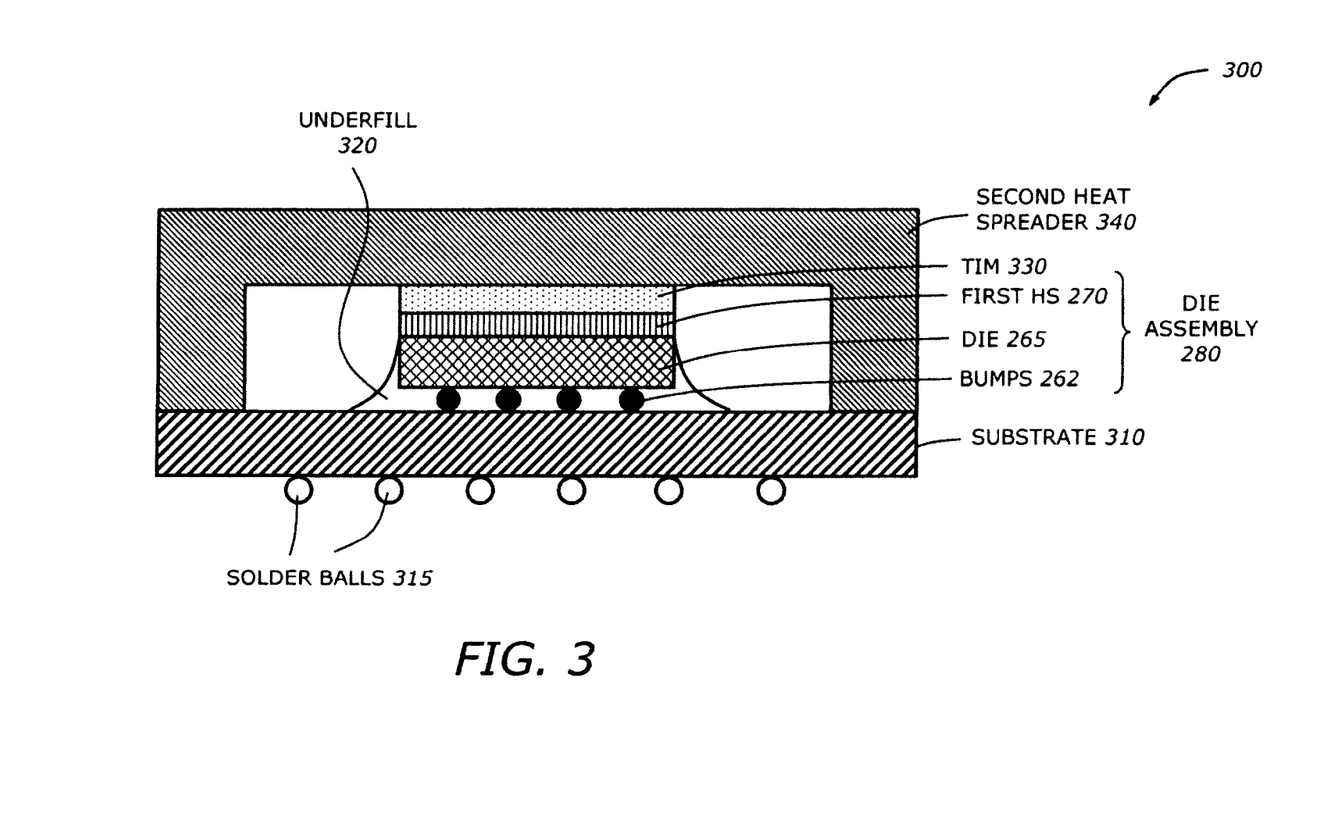
FIG. 3 is a diagram illustrating a package according to one embodiment of the invention.

FIG. 3 is a diagram illustrating a package 300 according to one embodiment of the invention. The package 300 includes a substrate 310, the die assembly 280, an underfill 320, a thermal interface material (TIM) 330, and a second or integral heat spreader (IHS) 340.

The substrate 310 is a package substrate that provides support for the die assembly 280. The substrate 310 may be polymer or a composite. The substrate 310 may be selected for any suitable packaging technologies including Ball Grid Array (BGA), Pin Grid Array (PGA), or Land Grid Array (LGA). A number of solder balls 315 may be attached to the substrate 310. The solder balls 315 allow attachment of the package device 165 to a circuit board or to any other mounting component. The die assembly 280 includes any semiconductor die. It may have a microelectronic device such as a microprocessor, a memory, an interface chip, an integrated circuit, etc. The die assembly 280 is attached to the substrate 310 by a number of solder bumps 285. The bumps 285 provide contact with the contact pads on the substrate. The bumps 285 may be fabricated using any standard manufacturing or fabrication techniques such as the controlled collapse chip connect (C4) technique. The underfill 320 is dispensed between die assembly 280 and the substrate 310 to strengthen the attachment of die assembly 280 to the substrate 310 to help prevent the thermal stresses from breaking the connections between die assembly 280 and the substrate 310. The stresses may be caused by the difference between the coefficients of thermal expansion of die assembly 280 and the substrate 310. The underfill 320 may contain filler particles suspended in an organic resin. The size of the filler particles are typically selected according to a gap between the die assembly 280 and the substrate 310, e.g., the filler particles have a diameter about one third the size of the gap. Generally, the composition and concentration of filler particles are selected to control the coefficient of thermal expansion of the underfill 320.

The IHS 340 may house or cover the die assembly 280 on the substrate 310. It may include a flat surface and supporting walls on both or four sides of the die assembly 280. During operation, the die assembly 280 may generate heat. The heat may be transferred to the IHS 340 through the TIM 330. The TIM 330 may be located, or interposed, between the bottom surface of the IHS 340 and the top surface of the die assembly 280. It may be attached to a heat generating device, such as the die assembly 280, to transfer the heat to a heat spreader or a heat sink or any another heat dissipating device. The TIM 330 may be made of a solder, thermally conductive adhesive, or thermal grease.

Figure 4:
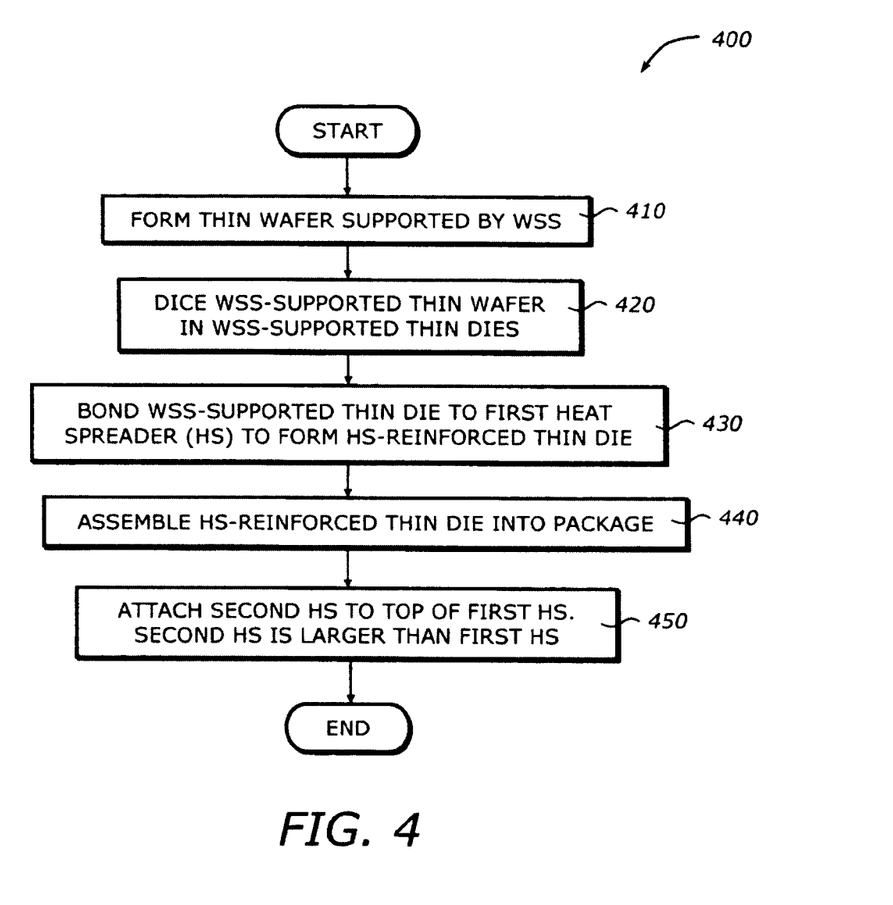
FIG. 4 is a flowchart illustrating a process to package a heat spread-reinforced device dice according to one embodiment of the invention.

FIG. 4 is a flowchart illustrating a process 400 to package a heat spread-reinforced device dice according to one embodiment of the invention.

Upon START, the process 400 forms a thin wafer supported by a WSS (Block 410). Then, the process 400 dices, saws, or singulates the WSS-supported thin wafer layer into a number of WSS-supported thin dice (Block 420). Next, the process 400 bonds a WSS-supported thin die to a first HS to form a HS-reinforced thin die (Block 430).

Next, the process 400 assembles the HS-reinforced thin die into a package (Block 440). Then, the process 400 attaches a second HS to top of the first HS (Block 450). The second HS is larger than the first HS. The second HS may be a conventional integrated HS used in a standard microprocessor package. The first HS and the second HS may be made from different or the same materials. The process 400 is then terminated.

Figure 5:
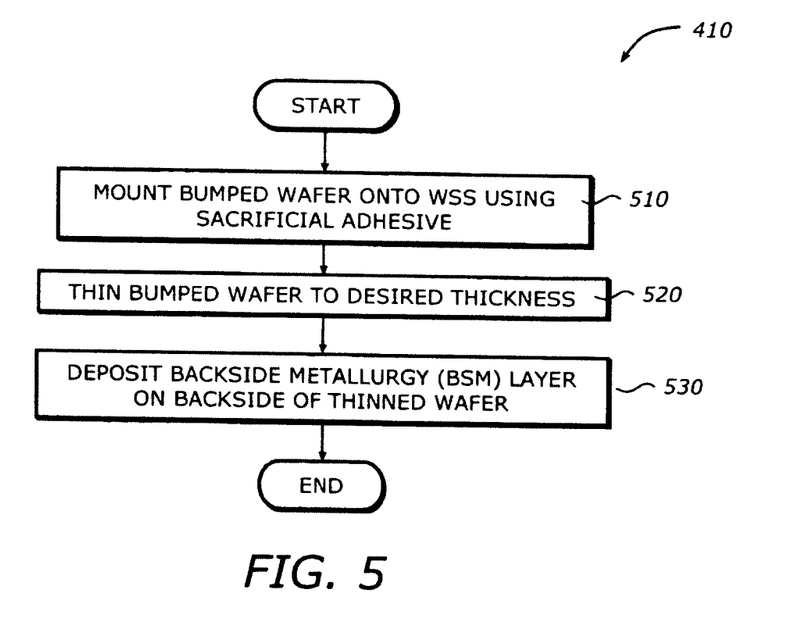
FIG. 5 is a flowchart illustrating a process to form a thin wafer supported by WSS according to one embodiment of the invention.

FIG. 5 is a flowchart illustrating the process 410 shown in FIG. 4 to form a thin wafer supported by WSS according to one embodiment of the invention.

Upon START, the process 410 mounts a bumped wafer onto the WSS using a sacrificial adhesive (Block 510). Then, the process 410 thins the bumped wafer to a desired thickness (Block 520). For ultra-thin dice, the desired thickness is less than 75 μm. Next, the process 410 deposits a backside metallurgy (BSM) layer on backside of the thinned wafer (Block 530). The process 410 is then terminated.

Figure 6:
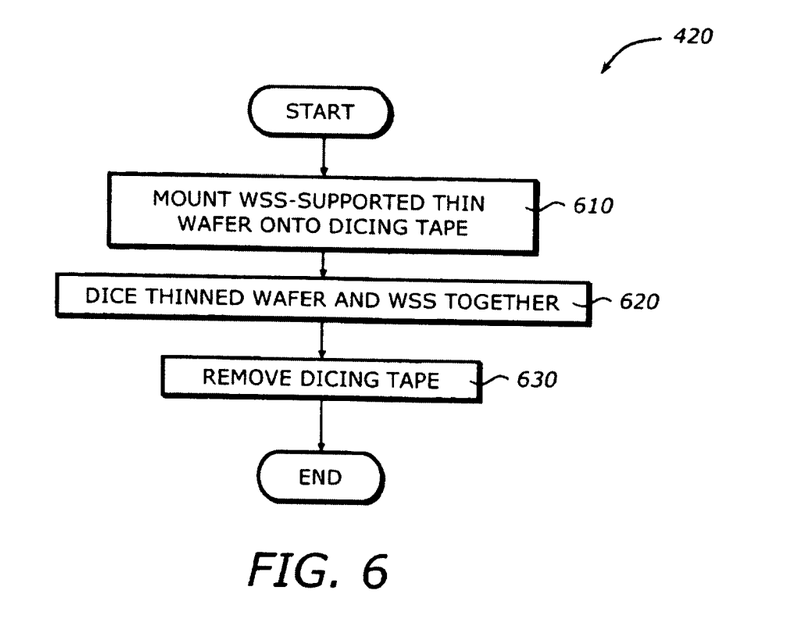
FIG. 6 is a flowchart illustrating a process to dice a WSS-supported thin wafer according to one embodiment of the invention.

FIG. 6 is a flowchart illustrating the process 420 shown in FIG. 4 to dice a WSS-supported thin wafer according to one embodiment of the invention.

Upon START, the process 420 mounts the WSS-supported thin wafer onto a dicing tape (Block 610). Then, the process 420 dices the thinned wafer and the WSS together (Block 620). Next, the process 420 removes the dicing tape (Block 630). The process 420 is then terminated.

Figure 7:
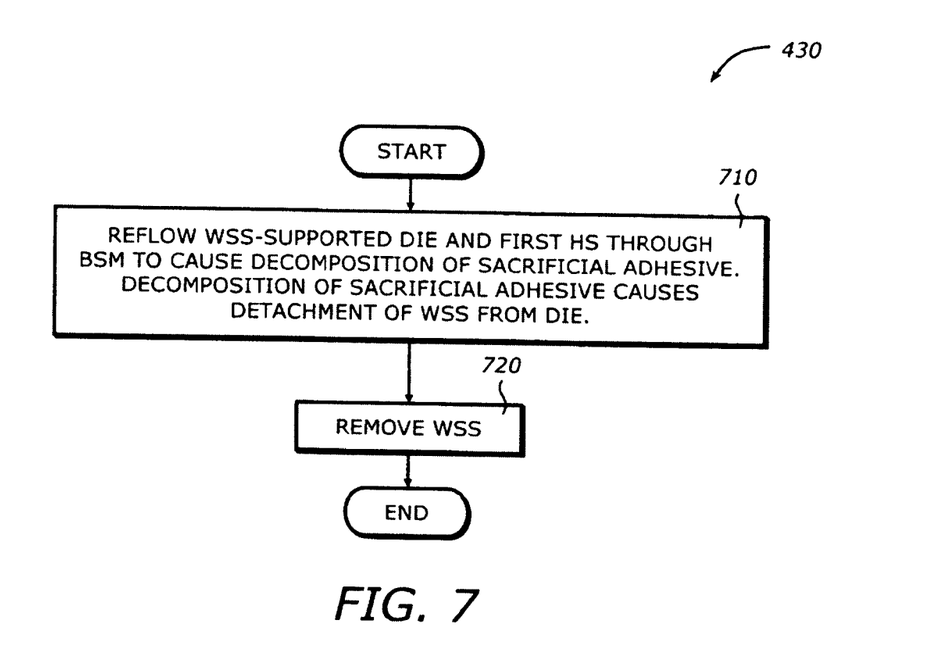
FIG. 7 is a flowchart illustrating a process to bond a WSS-supported thin die to a first HS according to one embodiment of the invention.

FIG. 7 is a flowchart illustrating the process 430 shown in FIG. 4 to bond a WSS-supported thin die to a first HS according to one embodiment of the invention.

Upon START, the process 430 reflows the WSS-supported die and the first heat spreader fitting the die through the BSM (Block 710). The reflowing causes decomposition of the sacrificial adhesive into gases. The decomposition of the sacrificial adhesive causes detachment of the WSS from the die. Next, the process 430 removes the WSS (Block 720). The process 430 is then terminated.

Embodiments of the invention have been described with a package having a HS-reinforced die. The mini HS provides mechanical reinforcement to facilitate wafer and die handling.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   providing a wafer containing a plurality of dice;
   attaching the wafer containing the plurality of dice to a wafer support substrate (WSS) to obtain a WSS-supported wafer;
   thinning the wafer while attached to the WSS to obtain a WSS-supported thin wafer;
   dicing the WSS-supported thin wafer into individual die assemblies to obtain a plurality of WSS-supported thin die; and
   bonding one of the plurality of WSS-supported thin die to a first heat spreader (HS) to form a HS-reinforced thin die.

2. The method of claim 1 wherein forming the WSS-supported thin wafer comprises:
   mounting the wafer onto the WSS using a sacrificial adhesive, the wafer being a bumped wafer;
   thinning the bumped wafer to a desired thickness; and
   depositing a backside metallurgy (BSM) layer on a backside of the thinned wafer.

3. The method of claim 2 wherein dicing the WSS-supported thin wafer comprises:
   mounting the WSS-supported thin wafer onto a dicing tape;
   dicing the thinned wafer and the WSS together; and
   removing the dicing tape.

4. The method of claim 3 wherein bonding the one of the plurality of WSS-supported die comprises:
   reflowing the WSS-supported die and the first heat spreader fitting the die through the BSM layer to cause decomposition of the sacrificial adhesive, the decomposition of the sacrificial adhesive causing detachment of the WSS from the die.

5. The method of claim 1 further comprises:
   assembling the HS-reinforced thin die into a package; and
   attaching a second HS to top of the first HS, the second HS being larger than the first HS.

6. The method of claim 2 wherein thinning the bumped wafer comprises:
   thinning the bumped wafer to the desired thickness of less than 75 μm.

7. A method comprising:
   providing a wafer containing a number of dice, wherein the wafer has a front side and a back side;
   mounting a support substrate to the front side of the wafer;
   thinning the wafer while attached to the support substrate to a desired thickness;
   dicing the thinned wafer and the support substrate to obtain a plurality of substrate supported thin die; and
   bonding a first heat spreader to the back side of one of said dice.

8. The method of claim 7, wherein a size of the first heat spreader is the same or slightly larger than the die.

9. The method of claim 7 further comprising:
   mounting the support substrate to the front side of the wafer by a sacrificial adhesive; and
   removing the support substrate by decomposing the sacrificial adhesive during bonding the first heat spreader to the back side of one of said dice.

10. The method of claim 9 further comprising:
    attaching a second heat spreader to a top of the first heat spreader, wherein the second heat spreader is larger than the first heat spreader.

11. A method comprising:
    providing a wafer containing a number of dice, wherein the wafer has a front side and a back side;
    mounting a support substrate to the front side of the wafer using a sacrificial adhesive;
    thinning the wafer while attached to the support substrate to a desired thickness;
    depositing a backside metallurgy layer on the back side of the thinned wafer;
    mounting the wafer into a dicing tape;
    dicing the thinned wafer and the support substrate to obtain a plurality of substrate supported thin die; and
    removing the dicing tape;
    bonding a first heat spreader to the back side of one of said dice, wherein the size of the first heat spreader is the same or slightly larger than the die; and
    detaching the support substrate from said die by decomposing the sacrificial adhesive.

* * * * *

UNITED STATES PATENT AND TRADEMARK OFFICE
CERTIFICATE OF CORRECTION

PATENT NO.         : 8,642,386 B2                                          Page 1 of 1
APPLICATION NO.    : 13/206390
DATED              : February 4, 2014
INVENTOR(S)        : Lu It is certified that error appears in the above-identified patent and that said Letters Patent is hereby corrected as shown below:

In the Claims

In column 8, at line 21 claim 7, delete, "the" and insert --a--.

Signed and Sealed this
Twentieth Day of May, 2014

Michelle K. Lee
*Deputy Director of the United States Patent and Trademark Office*